(12) United States Patent
Bates et al.

(10) Patent No.: US 10,007,458 B2
(45) Date of Patent: Jun. 26, 2018

(54) METHOD OF CONFIGURING MEMORY CELLS IN A SOLID STATE DRIVE BASED ON READ/WRITE ACTIVITY AND CONTROLLER THEREFOR

(71) Applicant: Microsemi Solutions (U.S.), Inc., Aliso Viejo, CA (US)

(72) Inventors: Stephen Bates, Canmore (CA); Rahul Advani, Los Gatos, CA (US)

(73) Assignee: Microsemi Solutions (U.S.), Inc., Aliso Viejo, CA (US)

( * ) Notice: Subject to any disclaimer, the term of this patent is extended or adjusted under 35 U.S.C. 154(b) by 0 days. days.

(21) Appl. No.: 14/974,803

(22) Filed: Dec. 18, 2015

(65) Prior Publication Data

US 2017/0177258 A1    Jun. 22, 2017

(51) Int. Cl.
*G06F 3/06*       (2006.01)
*G06F 12/02*      (2006.01)
(Continued)

(52) U.S. Cl.
CPC .......... *G06F 3/0629* (2013.01); *G06F 3/0604* (2013.01); *G06F 3/0644* (2013.01); *G06F 3/0679* (2013.01); *G06F 12/0246* (2013.01); *G11C 11/5621* (2013.01); *G11C 16/0483* (2013.01); *G06F 2212/7206* (2013.01); *G11C 2211/5641* (2013.01)

(58) Field of Classification Search
CPC ......... G06F 12/0246; G06F 2212/2022; G06F 2212/213; G06F 2212/7204; G06F 2212/7206; G06F 3/0629; G06F 3/0604; G06F 3/0644; G06F 3/0679; G11C 11/5621; G11C 11/56; G11C 2211/5641; G11C 11/5628; G11C 11/5642; G11C 16/10; G11C 16/26
See application file for complete search history.

(56) References Cited

U.S. PATENT DOCUMENTS 8,918,583 B2 * 12/2014 Hoang ................... G06F 1/26
                                                  324/76.11
9,378,136 B1 *  6/2016 Martin ................ G06F 12/0246
(Continued)

*Primary Examiner* — Glenn Gossage
(74) *Attorney, Agent, or Firm* — Leber IP Law; Dennis R. Haszko

(57) ABSTRACT

A solid-state storage device (SSD) controller is provided for use with an SSD. The SSD includes a plurality of memory cells, such as non-volatile memory (NVM) cells. The SSD controller comprises a processor and a memory storing statements and instructions for execution by the processor to perform a method of configuring the memory cells. In a dynamic configuration implementation in which at least a subset of the NVM cells are configured in a first bit retention mode, the method includes: monitoring data activity in relation to the SSD; and dynamically reconfiguring the subset of the NVM cells in a second bit retention mode based on the monitored data activity, such as whether data traffic comprises a majority of read activity or write activity. In a static configuration implementation, the method includes receiving at least one performance characteristic for the NVM cells; and configuring the subset of the NVM cells in a first bit retention mode based on the received at least one performance characteristic.

4 Claims, 7 Drawing Sheets

(51) Int. Cl.
  *G11C 11/56* (2006.01)
  *G11C 16/04* (2006.01)

(56) References Cited

U.S. PATENT DOCUMENTS

| | | | |
|---|---|---|---|
| 2005/0273548 A1* | 12/2005 | Roohparvar | G11C 11/5621 711/103 |
| 2008/0198651 A1* | 8/2008 | Kim | G06F 12/0246 365/185.03 |
| 2009/0259799 A1* | 10/2009 | Wong | G06F 12/0207 711/103 |
| 2009/0327590 A1* | 12/2009 | Moshayedi | G06F 11/1441 711/103 |
| 2010/0169602 A1* | 7/2010 | Hulbert | G06F 12/0246 711/165 |
| 2011/0208896 A1* | 8/2011 | Wakrat | G06F 12/0246 711/103 |
| 2012/0278532 A1* | 11/2012 | Bolanowski | G06F 12/0246 711/103 |
| 2013/0024601 A1* | 1/2013 | Floman | G06F 12/0246 711/103 |
| 2013/0124787 A1 | 5/2013 | Schuette | |
| 2013/0227203 A1* | 8/2013 | Marotta | G11C 16/16 711/103 |
| 2013/0254458 A1* | 9/2013 | Pittelko | G06F 12/02 711/103 |
| 2014/0250257 A1* | 9/2014 | Khan | G11C 16/10 711/103 |
| 2017/0075812 A1* | 3/2017 | Wu | G06F 12/0893 |

* cited by examiner

METHOD OF CONFIGURING MEMORY CELLS IN A SOLID STATE DRIVE BASED ON READ/WRITE ACTIVITY AND CONTROLLER THEREFOR

FIELD

The present disclosure relates to solid-state storage devices (SSDs), including but not limited to a method of configuring memory cells in an SSD and a controller therefor.

BACKGROUND

Non-Volatile Memory (NVM) is used extensively in solid-state storage devices (SSDs), also referred to as solid-state drives. Currently, NAND Flash is the most common type of NVM used in SSDs.

Originally, NAND flash employed charge trapping to store one bit per cell. This was referred to as Single Level Cell (SLC) NAND. As the technology matured and as the market demanded lower cost per bit, new NAND Flash emerged that can store two bits per cell (multi-level cell or MLC) and even three bits per cell (triple-level cell or TLC). SLC, MLC, MLC with improved endurance (MLC+) and TLC are referred to herein as NVM storage modes. Research is also pushing development of four bit per cell (quad-level cell or QLC) NAND.

Consumers of SSDs are often looking for a range of properties in their drives. For example, some customers are looking for read-intensive drives and the lowest price per GB of storage. Other customers want a more write-intensive drive and are willing to pay more per gigabyte (GB) in order to obtain that performance. As such, it becomes necessary for SSD manufacturers to produce a number of distinct SSD products, also referred to in relation to stock keeping units (SKUs). These different SSD SKUs are physically different devices and often contain different types of NAND. Managing SKUs and procuring NAND is a major challenge for an SSD vendor.

Improvements in the use of NVM in SSDs are desirable.

BRIEF DESCRIPTION OF THE DRAWINGS

Embodiments of the present disclosure will now be described, by way of example only, with reference to the attached Figures.

DETAILED DESCRIPTION

Figure 1:
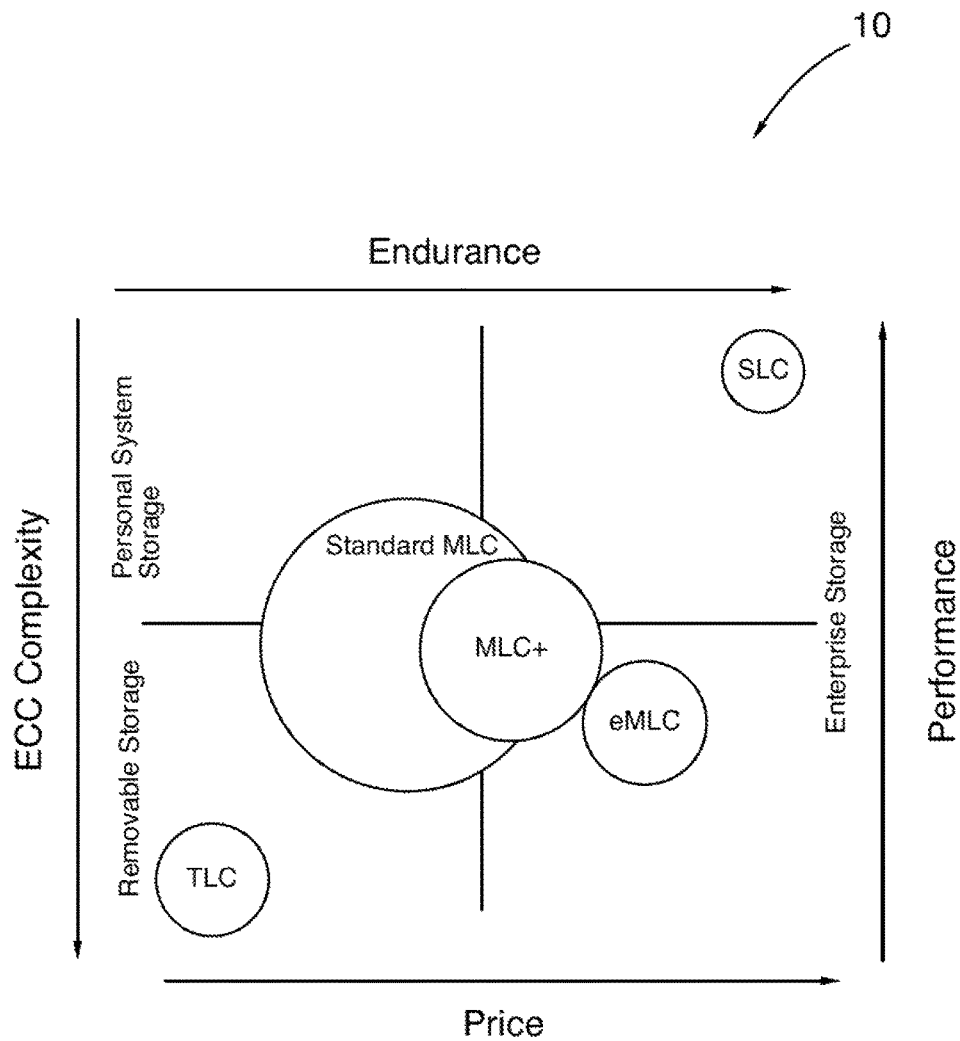
FIG. 1 is a scatterplot illustrating characteristics of certain types of NAND flash memory.

A solid-state storage device (SSD) controller is provided for use with an SSD. The SSD includes a plurality of memory cells, such as non-volatile memory (NVM) cells. The SSD controller comprises a processor and a memory storing statements and instructions for execution by the processor to perform a method of configuring the memory cells. In a dynamic configuration implementation in which at least a subset of the NVM cells are configured in a first bit retention mode, the method includes: monitoring data activity in relation to the SSD; and dynamically reconfiguring the subset of the NVM cells in a second bit retention mode based on the monitored data activity. In a static configuration implementation, the method includes receiving at least one performance characteristic for the NVM cells; and configuring the subset of the NVM cells in a first bit retention mode based on the received at least one performance characteristic.

According to embodiments of the present disclosure, a controller that manages the NVM memory dynamically alters the storage capabilities of each NVM cell based on workload and/or defined performance characteristics or requirements. These changes may be performed on single cells or, on a group of cells, for example a page or block or package. In another embodiment, a split of NVM cells between a plurality of NVM storage modes, or NVM states, is statically assigned at Beginning of Life (BoL), or altered dynamically at the level of an individual SSD, or both.

In an embodiment, the present disclosure provides a solid-state storage device (SSD) controller for use with an SSD, the SSD including a plurality of non-volatile memory (NVM) cells. The SSD controller comprises: a processor; and a memory storing statements and instructions for execution by the processor to: monitor data activity in relation to the SSD, at least a subset of the plurality of NVM cells being configured in a first bit retention mode, the plurality of NVM cells each being configurable to operate in a plurality of bit retention modes, each of the plurality of bit retention modes enabling storage of one or more bits of information in the plurality of NVM cells; and dynamically reconfigure the subset of the NVM cells in a second bit retention mode based on the monitored data activity, the second bit retention mode being different from the first bit retention mode.

In an example embodiment, the plurality of NVM cells comprise NAND flash memory cells. In an example embodiment, the first and second bit retention modes are selected from the group consisting of: single-level cell (SLC) mode retaining 1 bit; multi-level cell (MLC) mode retaining 2 bits; triple-level cell (TLC) mode retaining 3 bits; and a four-level or quad-level cell (QLC) mode retaining 4 bits.

In an example embodiment, the monitored data activity comprises traffic patterns into and out of the SSD. In an example embodiment, the memory stores statements and instructions for execution by the processor to dynamically reconfigure the subset of the NVM cells in a triple-level cell (TLC) mode based on the monitored data activity comprising a majority of read activity. In an example embodiment, the memory stores statements and instructions for execution by the processor to dynamically reconfigure the subset of the NVM cells in a single-level cell (SLC) mode or multi-level cell (MLC) mode based on the monitored data activity comprising a majority of write activity.

In an example embodiment, the memory stores statements and instructions for execution by the processor to dynamically reconfigure the subset of the NVM cells from a triple-level cell (TLC) mode to a multi-level cell (MLC) mode based on the monitored data activity.

In an example embodiment, the monitored data activity comprises data provided by a host in communication with the SSD.

In another embodiment, the present disclosure provides a solid-state storage device (SSD) controller for use with an SSD, the SSD including a plurality of non-volatile memory (NVM) cells. The SSD controller comprises: a processor; and a memory storing statements and instructions for execution by the processor to: receive at least one performance characteristic for the NVM cells, at least a subset of the plurality of NVM cells being configurable to operate in a plurality of bit retention modes, each of the plurality of bit retention modes enabling storage of one or more bits of information in the NVM cells; and configure the subset of the plurality of NVM cells in a first bit retention mode based on the received at least one performance characteristic.

In an example embodiment, the plurality of NVM cells comprise NAND flash memory cells. In an example embodiment, the at least one performance characteristic comprises an initial configuration characteristic.

In an example embodiment, the at least one performance characteristic comprises a subsequent configuration characteristic, and the memory further stores statements and instructions for execution by the processor to: monitor data activity in relation to the SSD; and reconfigure the subset of the NVM cells in a first bit retention mode based on the monitored data activity.

In an example embodiment, the at least one performance characteristic is selected from the group consisting of: read speed, write speed, bit density, and cell life.

In an example embodiment, the memory stores statements and instructions for execution by the processor to configure the subset of the NVM cells in the first bit retention mode based on a selected partitioning configuration selected from a plurality of partitioning configurations associated with the SSD.

In another embodiment, the present disclosure provides a method of configuring non-volatile memory (NVM) cells in a solid-state storage device (SSD) comprising: receiving at least one performance characteristic for the NVM cells, at least a subset of the NVM cells being configurable to operate in a plurality of bit retention modes, each of the plurality of bit retention modes enabling storage of one or more bits of information in the NVM cells; and configuring the subset of the NVM cells in a first bit retention mode based on the received at least one performance characteristic.

In an example embodiment, configuring the subset of the NVM cells in the first bit retention mode is performed at a customer site after production of the SSD using a post-production tool.

In a further embodiment, the present disclosure provides a method of producing a solid-state storage device (SSD), the SSD including a plurality of non-volatile memory (NVM) cells, the method comprising: receiving at least one performance characteristic for the NVM cells, at least a subset of the NVM cells being configurable to operate in a plurality of bit retention modes, each of the plurality of bit retention modes enabling storage of one or more bits of information in the plurality of NVM cells; and prior to completing production of the SSD, configuring the subset of the NVM cells in a first bit retention mode based on the received at least one performance characteristic.

In an example embodiment, configuring the subset of the NVM cells in the first bit retention mode is performed at assembly time as part of a manufacturing process for the SSD.

In an example embodiment, configuring the subset of the NVM cells in the first bit retention mode is performed in a last phase of the manufacturing process prior to shipping the SSD to a customer.

In another embodiment, the present disclosure provides a solid-state storage device (SSD) comprising: a plurality of non-volatile memory (NVM) cells comprising NAND flash memory cells, at least a subset of the plurality of non-volatile memory (NVM) cells being configurable to operate in a plurality of bit retention modes, each of the plurality of bit retention modes enabling storage of one or more bits of information in the plurality of NVM cells. The SSD further comprises an SSD controller configured to: receive at least one performance characteristic for the NVM cells; and configure the subset of the NVM cells in a first bit retention mode based on the received at least one performance characteristic.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

In accordance with embodiments of the present disclosure, an SSD comprises a plurality of NVM cells, each NVM cell being configurable to operate in a plurality of NVM storage modes, or bit retention modes. Each NVM storage mode has a corresponding or associated NVM cell configuration. In an embodiment, the mode of the NVM cells in an SSD is fixed or reconfigured according to the desired characteristics of the cells. In an embodiment, a memory controller, or SSD controller, configures the modes of the NVM cells either semi-dynamically at the beginning of life, or dynamically during operation. The mode of a particular cell or group of cells is based on the defined performance characteristics of the cell(s) including, without limitation, read and write speeds (performance), bit density (capacity), and (cell life) endurance. In an embodiment, the controller monitors usage of the SSD to determine the correct modes for the NVM cells.

FIG. 1 is a scatterplot illustrating characteristics of certain types of NAND flash, including Single Level Cell (SLC) NAND flash, two bits per cell (multi-level cell or MLC) and even three bits per cell (triple-level cell or TLC) and MLC+. MLC+ is an improved version of MLC, which still uses 2 bits per cell but has more endurance (program-erase or PE cycles) than standard MLC. QLC (not shown) is different in that it has 4 bits per cell, and can typically store more data than MLC but has much lower endurance. As shown in FIG. 1, different types of NAND flash have different properties with respect to endurance, performance, price and complexity. Newer NAND flash offers the ability to store one, two, or even three bits per cell. It also offers the ability to alter this number of stored bits per cell over the life of the memory. Embodiments of the present disclosure take advantage of this feature to allow the SSD to trade one or more of capacity, endurance, or performance in a way that allows adaptation to user-requirements and workloads.

A feature of NAND flash that is taken advantage of by embodiments of the present disclosure is that SLC, MLC, TLC and even QLC NAND flash are inherently substantially identical at the cell level. Therefore a TLC NAND flash can be placed into a MLC or even SLC mode. A switch between modes can be implemented as a sequence of commands on the interface into the NAND flash. In example embodiments, this interface is either ONFI or Toggle, depending on the vendor. In examples embodiments, the sequence of commands involves placing some combination of command, address and data on the interface and then waiting for some period of time for the switch to take effect. For a number of reasons it is easier to run a TLC NAND in SLC mode than it is to run SLC NAND in TLC mode. Therefore, embodiments of the present disclosure will focus on example implementations in which an NVM cell is configured in a first mode with a higher number of bits per cell, and is converted to a second mode with a lower number of stored bits per cell.

It is important to note that certain properties of the NAND flash do differ between the different modes of operation. These parameters can be traded off against the change in capacity implicit in the transition from one mode to another. The benefits of such a trade-off form a motivation for embodiments of the present disclosure.

In embodiments of the present disclosure, the state of the NAND flash used to construct an SSD is altered. In an embodiment, the state of the NAND flash comprises a physical configuration of NAND cells that corresponds to a desired NVM state. This alteration can occur either once, at time of construction or dynamically during the life of the drive. These alterations are done to trade the capacity of the SSD for other properties such as endurance and performance, providing one or more of the following advantages: SSD vendors can now generate several SKUs of SSD from the same physical SSD; SSDs can adapt to their workload over time and be optimized based on the conditions that they are installed into; allow SSD vendors to consolidate NAND procurement to achieve volume discounting and supply chain stability.

Figure 2:
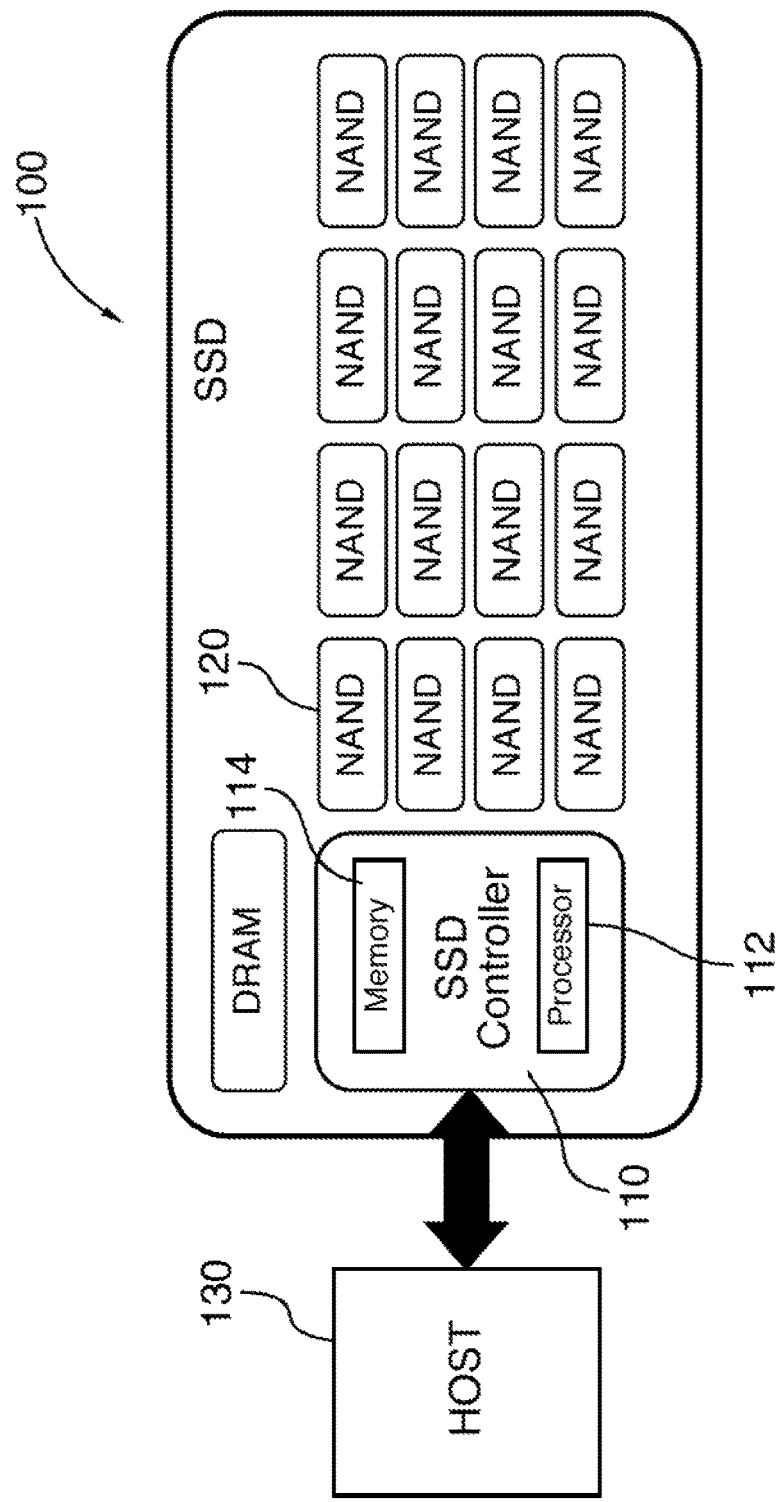
FIG. 2 is a block diagram illustrating an enterprise solid-state storage device (SSD) including an SSD Controller according to an embodiment of the present disclosure.

FIG. 2 is a block diagram illustrating an enterprise solid-state storage device (SSD) 100 including an SSD controller 110 according to an embodiment of the present disclosure. In an embodiment, the SSD controller 110 comprises a processor 112, and a memory 114 storing statements and instructions for execution by the processor 112 to perform method steps. The SSD 100 comprises a plurality of non-volatile memory (NVM) cells 120, for example NAND flash cells.

The SSD controller 110, which can be implemented as a controller chip, is used to communicate to the host 130 over a protocol such as SATA (Serial Advanced Technology Attachment), SAS (Serial Attached SCSI (Small Computer Systems Interface)) or PCIe/NVMe (Peripheral Component Interface express/Non-Volatile Memory express). The SSD controller 110 is responsible for abstracting the physical attributes of the NVM cells 120 from the host 130 and presenting a block interface to the host 130. As such, in an embodiment, the SSD controller 110 performs or manages one or more of: error management; logical to physical translation; wear-levelling; garbage collection.

Since the SSD controller does abstract the NVM cells 120 from the host 130, embodiments of the present disclosure use the SSD controller 110 to abstract the detail of the embodiments of the SSD 100 from the host 130.

Embodiments of the present disclosure provide advantages in situations in which a positive gain is achieved by reducing the capacity of the SSD. To this end, the present disclosure presents some of the parameters that change when NVM cells, such as NAND flash cells, are switched from TLC into MLC or SLC mode. These variations are given in Table 1 below, with respect to an example embodiment comprising NAND flash.

TABLE 1

| Mode | Bits/Cell | Write Speed | Read Speed | Endurance |
| --- | --- | --- | --- | --- |
| SLC (2D) | 1 | 1 ms | 20 us | 100,000 |
| MLC (2D) | 2 | 2 ms | 50 us | 10,000 |
| TLC (2D) | 3 | 5 ms | 150 us | 1,000 |

Note that there is a very large increase in endurance (program/erase cycles, or PE cycles) when making a shift from TLC to MLC and from MLC to SLC.

For example shifting all the NAND from TLC to MLC will reduce the capacity by 33% but will increase the endurance of those cells by 100%. In an embodiment, this shift can be done in a partial fashion by only converting some fraction of the NAND cells from TLC to MLC.

It is worth noting that there is an improvement in performance when a transition is made from TLC to MLC, providing another reason why the transition would be performed; again, this can be done for only a part of the drive or for the entire drive.

In an embodiment, such as shown in relation to FIG. 2, the SSD controller 110 comprises a processor 112 and a memory 114 storing statements and instructions for execution by the processor 112 to monitor data activity in relation to the SSD. At least a subset of the plurality of NVM cells 120 is configured in a first bit retention mode. The plurality of NVM cells 120 are each configurable to operate in a plurality of bit retention modes. Each of the plurality of bit retention modes enables storage of one or more bits of information in the plurality of NVM cells 120. The memory 114 further stores statements and instructions for execution by the processor 112 to dynamically reconfigure the subset of the NVM cells 120 in a second bit retention mode based on the monitored data activity. The second bit retention mode is different from the first bit retention mode.

In an embodiment, the first and second bit retention modes are selected from the group consisting of: single-level cell (SLC) mode retaining 1 bit; multi-level cell (MLC) mode retaining 2 bits; triple-level cell (TLC) mode retaining 3 bits; and a four-level or quad-level cell (QLC) mode retaining 4 bits. In an embodiment, the monitored data activity comprises traffic patterns into and out of the SSD, for example data provided by a host in communication with the SSD.

In an example embodiment in which the monitored data activity comprises a majority of read activity, the memory stores statements and instructions for execution by the processor to dynamically reconfigure the subset of the NVM cells in a triple-level cell (TLC) mode. In another example embodiment in which the monitored data activity comprises a majority of write activity, the memory stores statements and instructions for execution by the processor to dynamically reconfigure the subset of the NVM cells in a single-level cell (SLC) mode or multi-level cell (MLC) mode. For example, the SSD controller can dynamically reconfigure the subset of the NVM cells from a triple-level cell (TLC) mode to a multi-level cell (MLC) mode based on the monitored data activity.

Figure 3:
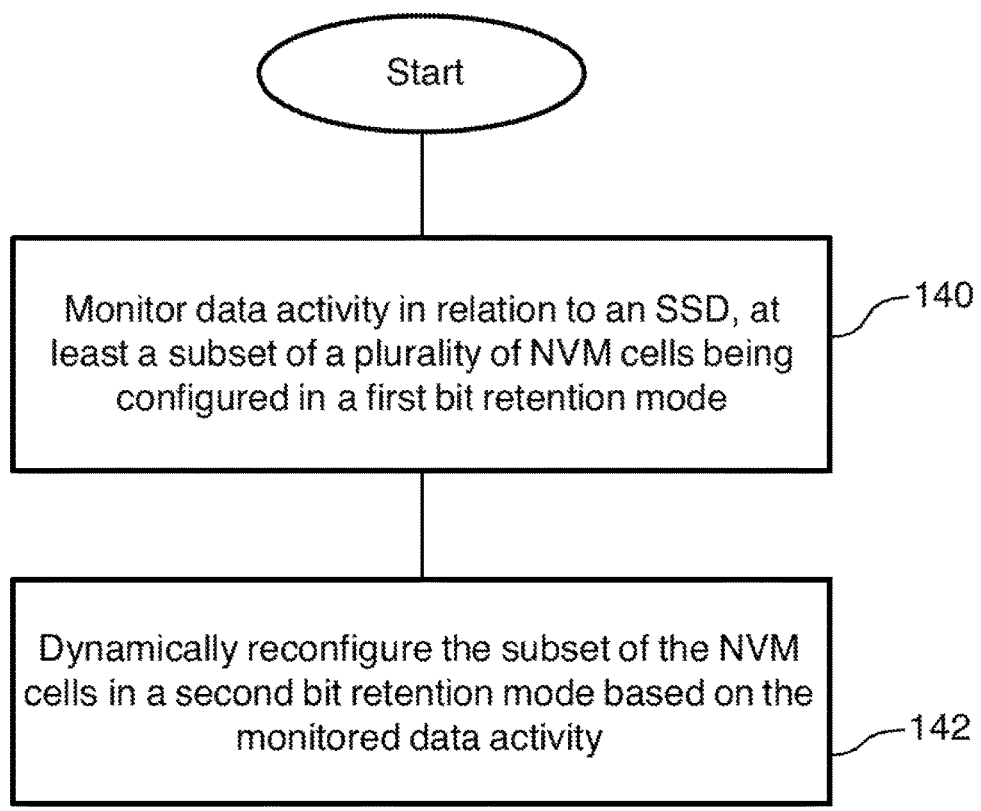
FIG. 3 is a flowchart illustrating a method of configuring NAND flash memory cells in an SSD according to an embodiment of the present disclosure.

FIG. 3 is a flowchart illustrating a method of configuring non-volatile memory (NVM) cells in an SSD according to an embodiment of the present disclosure. The method of FIG. 3 includes, at 140, monitoring data activity in relation to the SSD, at least a subset of the plurality of non-volatile memory (NVM) cells being configured in a first bit retention mode, the NVM cells each being capable of storing one or more bits of information. The method further includes, at 142, dynamically reconfiguring the subset of the NVM cells in a second bit retention mode based on the monitored data activity, the second bit retention mode being different from the first bit retention mode.

Figure 4A:
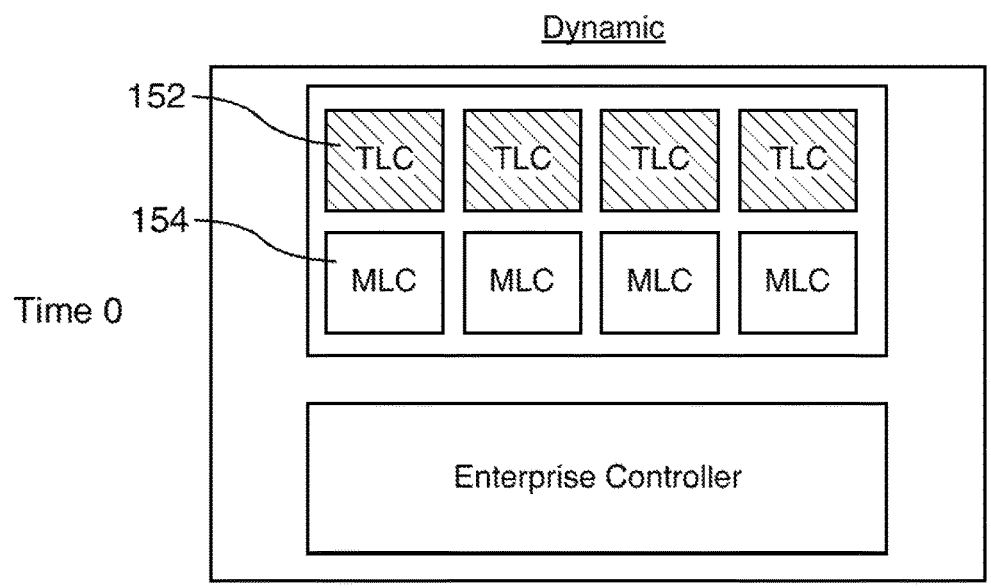
FIGS. 4A and 4B are block diagrams illustrating NAND configuration before and after dynamic configuration according to an embodiment of the present disclosure.
Figure 4B:
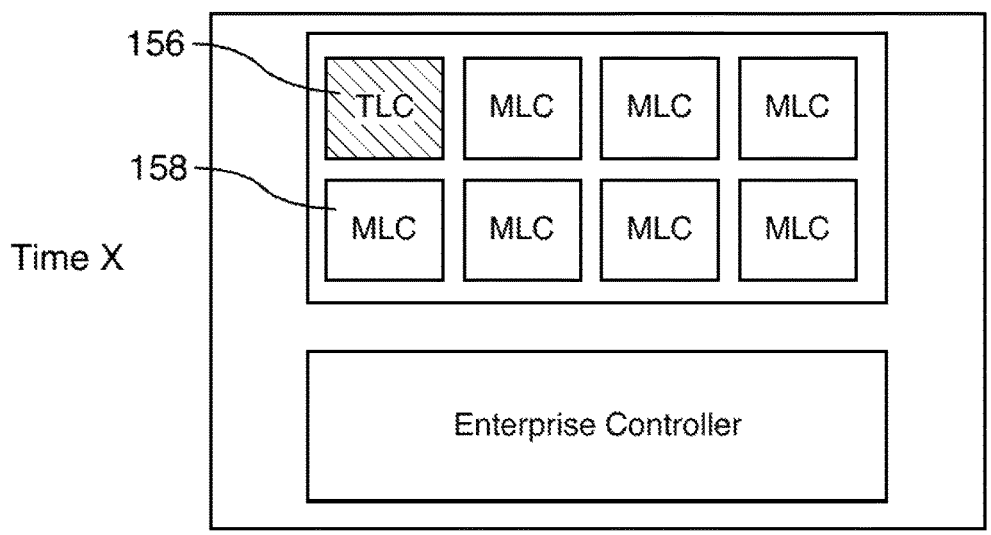

FIGS. 4A and 4B are block diagrams illustrating NAND configuration before and after dynamic configuration according to an embodiment of the present disclosure. In an example of the dynamic configuration embodiment, assume the SSD begins in a first configuration and then self-adjusts or is adjusted by the host, throughout the life of the SSD. In an embodiment, the self-adjustment is performed by the SSD controller. This adjustment can be performed based on observations of the traffic patterns into and out of the SSD.

For example, if it is determined that the workload is mostly reads, the controller may make a determination to place more NVM cells of the drive into TLC mode to provide additional capacity. If the workload is more write intensive, the controller may make a determination to place more NVM cells of the drive into MLC or even SLC mode at the expense of diminished capacity. Note that while it is uncommon for a block storage device to advertise a capacity that changes over the life of the drive, it is possible to accommodate this inside the host operating system so that such changes do not cause damage to the system.

In the example embodiment in FIG. 4A, the drive begins at time 0 in a first configuration. In the first configuration, a first subset of NVM cells 152 is configured in a first mode with a first number of bits per cell, and a second subset of NVM cells 154 is configured in a second mode with a second number of bits per cell. In an example embodiment, over time, the drive reacts to the workload presented to it and alters the configuration of some of the blocks.

FIG. 4B shows the SSD in a second configuration at time X. In the second configuration, a modified first subset of NVM cells 156 is configured in a first mode with a first number of bits per cell. A modified second subset of NVM cells 158 is configured in a second mode with a second number of bits per cell. As shown in FIG. 4B, some of the TLC cells that were in the first subset of NVM cells 152 (FIG. 4A) were switched from TLC to MLC mode; accordingly, those cells moved from the first subset of NVM cells 152 to the modified second subset of NVM cells 158. As discussed above, such a switch or reconfiguration can be performed based on data provided by the host or by monitoring the traffic coming into and out of the drive. In an example embodiment, the modified first and second subsets of NVM cells 156 and 158 are configured in a third mode and a fourth mode, respectively; in an example embodiment, one or both of the third mode and the fourth mode are the same as the first mode or the second mode.

Figure 5:
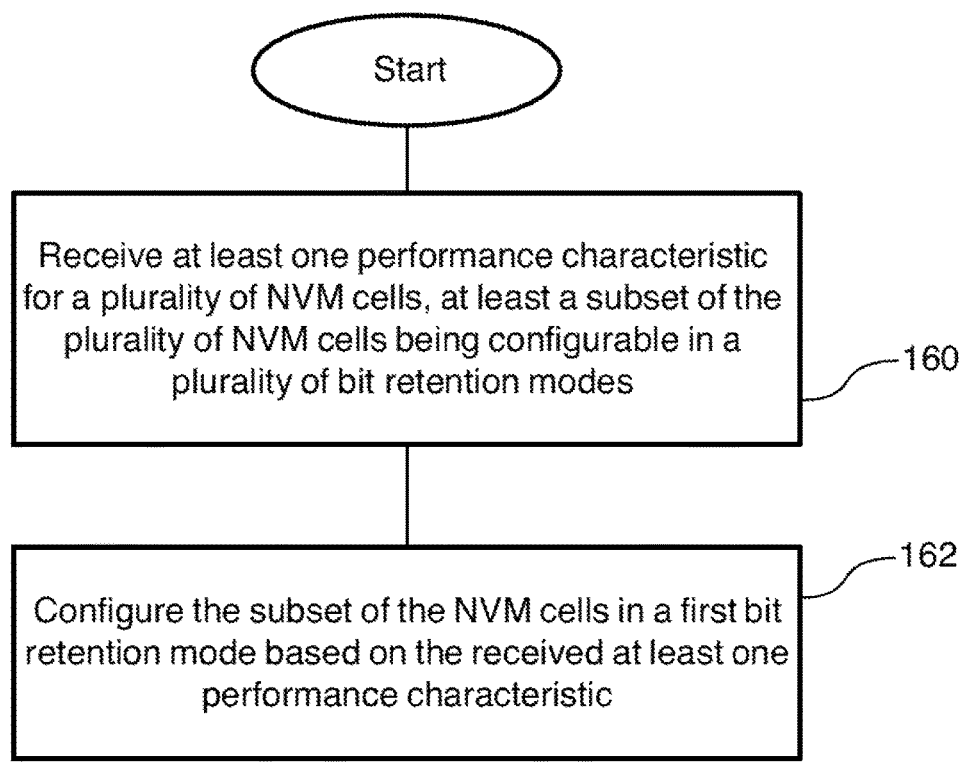
FIG. 5 is a flowchart illustrating a method of configuring NAND flash memory cells in an SSD according to another embodiment of the present disclosure.

FIG. 5 is a flowchart illustrating a method of configuring NVM cells, such as NAND flash memory cells, in an SSD according to another embodiment of the present disclosure. The method comprises, at 160, receiving at least one performance characteristic for the NVM cells. At least a subset of the NVM cells is configurable in a plurality of bit retention modes. The NVM cells are each capable of storing one or more bits of information. The method further comprises, at 162, configuring the subset of the NVM cells in a first bit retention mode based on the received at least one performance characteristic.

In the method in the embodiment of FIG. 5, at least one performance characteristic is received for the NVM cells, and the subset of the NVM cells is configured based on the received performance characteristic. In an example embodiment, the method is performed when the NVM cells are in a static configuration, such as before the SSD is in use, for example near the end of a manufacturing process for the NVM cells, or the SSD.

In contrast to known SSD approaches which fix the mode of each memory cell at the beginning of time and never adjust it, embodiments of the present disclosure provide the ability to adjust the mode of a subset of the NVM cells based on one or more received performance characteristics. In an example embodiment, the one or more received performance characteristics comprise measured performance characteristics. In another example embodiment, the one or more received performance characteristics comprise perceived or observed performance characteristics.

In an example embodiment, the method of the embodiment of FIG. 5 is based on a defined performance characteristic, which is received as part of the method, in contrast to the method of the embodiment of FIG. 3 which is based on monitored data activity. The received performance characteristic can be based on user performance requirements, or other specified performance parameters, such as parameters specified by a particular application for the SSD, or a standard with which the SSD is intended to comply or operate.

In an example embodiment, the present disclosure provides an SSD controller for use with an SSD, the SSD including a plurality of NVM cells, the SSD controller comprising: a processor; and a memory storing statements and instructions for execution by the processor to: receive at least one performance characteristic for the NVM cells, at least a subset of the plurality of NVM cells being configurable in a plurality of bit retention modes, the NVM cells each being capable of storing one or more bits of information; and configure the subset of the NVM cells in a first bit retention mode based on the received at least one performance characteristic.

In an example embodiment, the NVM cells comprise NAND flash memory cells. In an example embodiment, the performance characteristic comprises an initial configuration characteristic. In another example embodiment, the performance characteristic comprises a subsequent configuration characteristic, and the memory further stores statements and instructions for execution by the processor to: monitor data activity in relation to the SSD; and reconfigure the subset of the NVM cells in a first bit retention mode based on the monitored data activity. In an example embodiment, the performance characteristic is selected from the group consisting of: read speed, write speed, bit density, and cell life.

Figure 6A:
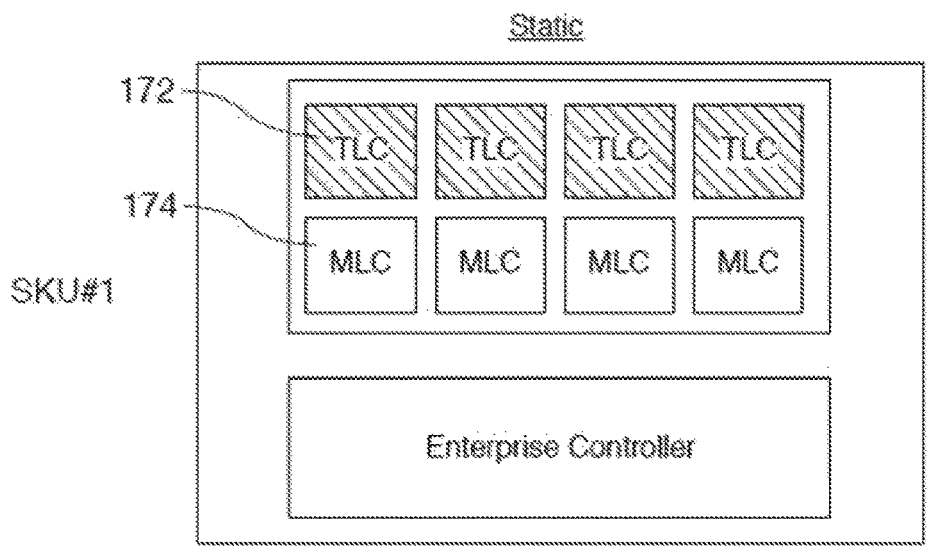
FIGS. 6A and 6B are block diagrams illustrating two different NAND configurations generated from the same physical drive according to a static configuration embodiment of the present disclosure.
Figure 6B:
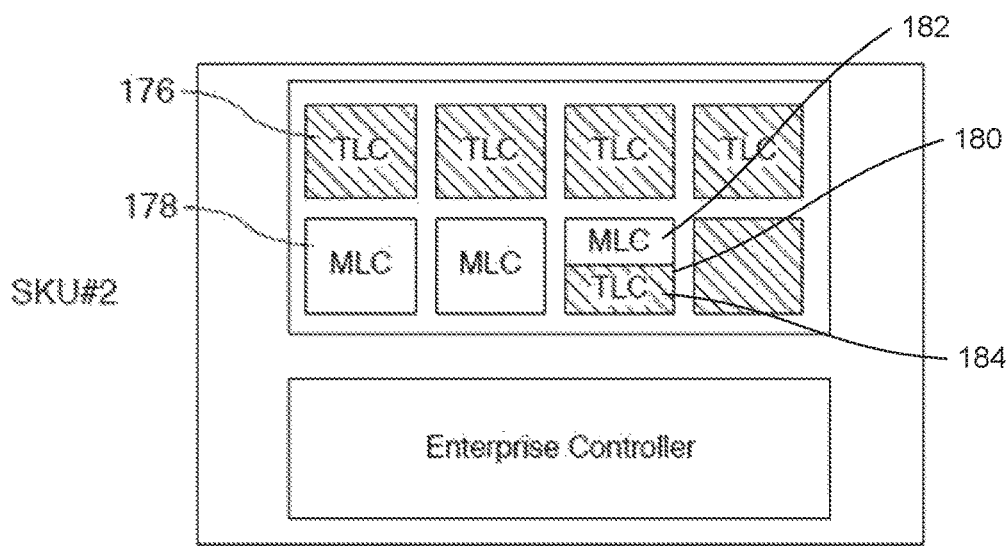

FIGS. 6A and 6B are block diagrams illustrating two different NVM configurations generated from the same physical drive according to a static configuration embodiment of the present disclosure. In an example static configuration embodiment, the provisioning of the drive into TLC, MLC, SLC and other upcoming modes is performed at assembly time as part of the manufacturing process. In another example embodiment, the provisioning can be performed as late as just prior to shipping the drive to customers or even at a customer site using a post-production tool. Example embodiments of the present disclosure provide a plurality of partitioning configurations associated with a particular SSD, or type of SSD. One of the plurality of partitioning configurations can be selected based on the received performance characteristic, to place the SSD into one of the plurality of partitioning configurations.

An example of two different static configuration options is given in FIGS. 6A and 6B, which can be considered as two different SKUs generated from the same physical drive or device. In this example, suppose the SSD begins with a base configuration. In the example embodiment in FIG. 6A, an SSD with a first static NVM configuration is created based on the base configuration. In an example embodiment of the first configuration, a first subset of NVM cells 172 is configured in a first mode with a first number of bits per cell, and a second subset of NVM cells 174 is configured in a second mode with a second number of bits per cell.

In an example embodiment, the configuration of the first and second subsets of NVM cells 172 and 174 together constitute a selected partitioning configuration that is selected from among a plurality of partitioning configurations associated with the SSD. In an example embodiment, in response to identifying the SSD as a first type of SSD, a first plurality of partitioning configurations is made available, the first plurality of partitioning configurations being associated with the first type of SSD. Similarly, for a second type of SSD, a second plurality of partitioning configurations is made available, the second plurality of partitioning configurations being associated with the second type of SSD. In an example embodiment, there may be some overlap in the partitioning configurations made available in the first and second pluralities of partitioning configurations.

FIG. 6B shows the SSD in a second static NVM configuration. In the second configuration, a third subset of NVM cells 176 is configured in a third mode with a third number of bits per cell. A fourth subset of NVM cells 178 is configured in a fourth mode with a fourth number of bits per cell. In an example embodiment, one or both of the third mode and the fourth mode may be the same as the first mode or the second mode.

In the example embodiment of the illustrated FIGS. 6A and 6B, the first subset of NVM cells 172 is configured in the same mode as the third subset of NVM cells 176. The second subset of NVM cells 174 differs from the fourth subset of NVM cells 178. For example, the fourth subset of NVM cells 178 includes one cell that is configured in the same mode as the first and third subsets of NVM cells. In the example embodiment of FIG. 6B, the fourth subset of NVM cells 178 also includes one block of NVM cells 180 that is concurrently configured in two modes, such that a first portion 182 of the block of NVM cells 180 is configured in a first mode and a second portion 184 of the block of NVM cells 180 is configured in a second mode. In other embodiments, the first and second static configurations vary in terms of at least one characteristic or configuration of a first subset of NVM cells, or a second subset of NVM cells, or both.

Figure 7:
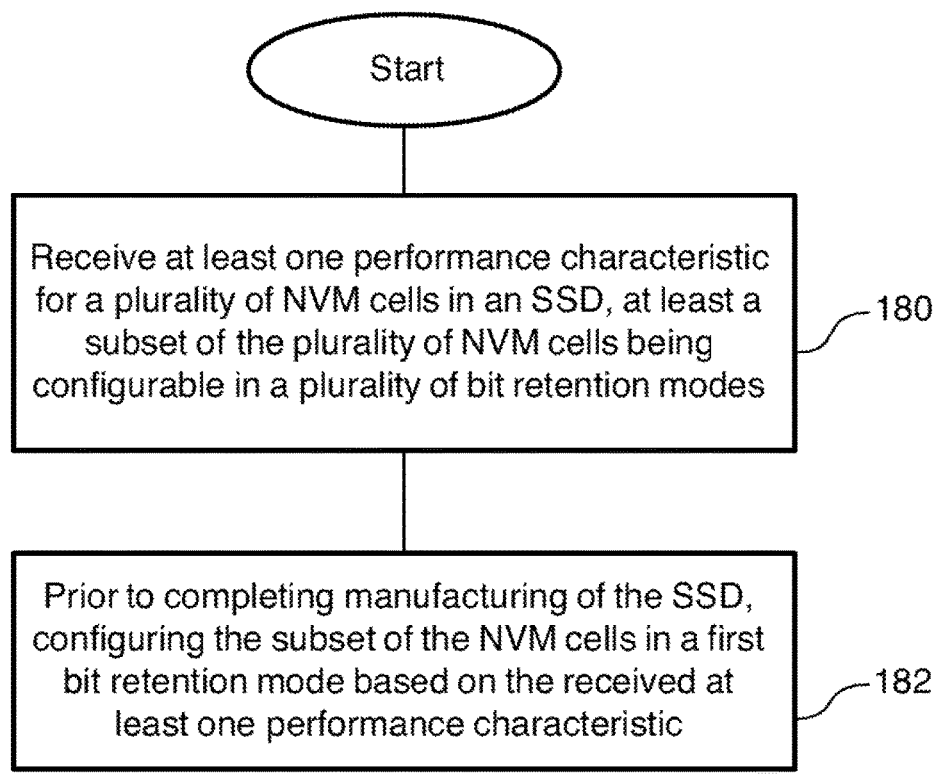
FIG. 7 is a flowchart illustrating a method of manufacturing an SSD including a plurality of NAND flash memory cells according to another embodiment of the present disclosure.

FIG. 7 is a flowchart illustrating a method of manufacturing an SSD including a plurality of NVM cells according to another embodiment of the present disclosure. The method comprises, at 180, receiving at least one performance characteristic for the NVM cells. At least a subset of the NVM cells is configurable in a plurality of bit retention modes, with the NVM cells each being capable of storing one or more bits of information. The method further comprises, at 182, prior to completing manufacturing of the SSD, configuring the subset of the NVM cells in a first bit retention mode based on the received at least one performance characteristic. The embodiment of FIG. 7 can be described as a method of manufacturing an SSD that includes a particular implementation of the embodiment of FIG. 5 with respect to performing the configuration of the subset of the NVM cells prior to completing manufacturing of the SSD.

Embodiments of the present disclosure can be used when implementing Solid-state Storage Devices (SSDs) based on NAND Flash or any other type of NVM that can store one or more bits of information per atomic element or cell.

Embodiments of the present disclosure take advantage of the fact that there is a capacity-performance-endurance trade-off that can be made, in a static or dynamic fashion, in the base structure of the NVM on the same SSD inside a system.

As mentioned earlier, managing different SKUs for physically different devices that often contain different types of NAND, as well as procuring NAND, can be a major challenge for a SSD vendor. In addition, prices for NAND typically come down with volume; so, using many instances of the same type of NAND can lead to procurement savings. For these reasons, as well as others, being able to build different SSDs from the same NAND, according to embodiments of the present disclosure, is a very attractive proposition.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A solid-state storage device (SSD) controller for use with an SSD, the SSD including a plurality of non-volatile memory (NVM) cells, at least a subset of the plurality of NVM cells being configured in a first bit retention mode, the plurality of NVM cells each being configurable to operate in a plurality of bit retention modes, each of the plurality of NVM storage bit retention modes enabling storage of one or more bits of information in the plurality of NVM cells, the SSD controller comprising:
- a processor; and
- a memory storing statements and instructions for execution by the processor to:
- monitor data traffic patterns into and out of the SSD;
- determine, based on the monitored data traffic patterns into and out of the SSD, whether the data traffic comprises a majority of read activity or a majority of write activity;
- dynamically reconfigure the subset of the plurality of NVM cells to operate in a second bit retention mode based on the monitored traffic patterns, the second bit retention mode being different from the first bit retention mode, by:
  - when the first bit retention mode of the subset of the plurality of NVM cells is a single-level cell (SLC) mode or a multi-level cell (MLC) mode, reconfiguring the subset of the plurality of NVM cells to operate in a triple-level cell (TLC) mode if the monitored traffic patterns are determined to comprise a majority of read activity; and
  - when the first bit retention mode of the subset of the plurality of NVM cells is a quad-level cell (QLC) mode or a TLC mode, reconfiguring the subset of the plurality of NVM cells to operate in the SLC mode or the MLC mode if the monitored traffic patterns are determined to comprise a majority of write activity.

2. The SSD controller of claim 1 wherein the plurality of NVM cells comprise NAND flash memory cells.

3. The SSD controller of claim 1 wherein reconfiguring the subset of the plurality of NVM cells to operate in the SLC mode or the MLC mode comprises reconfiguring the subset of the NVM cells from the QLC mode or the TLC mode to the MLC mode.

4. The SSD controller of claim 1 wherein the monitored data traffic patterns comprise data traffic patterns of data provided by a host in communication with the SSD.

* * * * *